(12) United States Patent
Huang et al.

(10) Patent No.: US 10,147,845 B2
(45) Date of Patent: Dec. 4, 2018

(54) SEMICONDUCTOR STRUCTURE

(71) Applicant: Genesis Photonics Inc., Tainan (TW)

(72) Inventors: Chi-Feng Huang, Tainan (TW); Ching-Liang Lin, Taoyuan (TW); Shen-Jie Wang, New Taipei (TW); Jyun-De Wu, Tainan (TW); Yu-Chu Li, Chiayi (TW); Chun-Chieh Lee, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/627,417

(22) Filed: Jun. 19, 2017

(65) Prior Publication Data

US 2017/0288092 A1 Oct. 5, 2017

Related U.S. Application Data

(63) Continuation of application No. 14/727,786, filed on Jun. 1, 2015, now Pat. No. 9,685,586, which is a (Continued)

(30) Foreign Application Priority Data

Nov. 19, 2012 (TW) .............................. 101143115 A

(51) Int. Cl.
*H01L 29/06* (2006.01)
*H01L 33/14* (2010.01)
(Continued)

(52) U.S. Cl.
CPC .......... *H01L 33/06* (2013.01); *H01L 33/0025* (2013.01); *H01L 33/02* (2013.01);
(Continued)

(58) Field of Classification Search
CPC ..... H01L 33/06; H01L 33/0025; H01L 33/02; H01L 33/12; H01L 33/14; H01L 33/32
See application file for complete search history.

(56) References Cited

U.S. PATENT DOCUMENTS

| 8,304,793 B2 | 11/2012 | Yoshizumi et al. |
| 2003/0006418 A1 | 1/2003 | Emerson et al. |

(Continued)

FOREIGN PATENT DOCUMENTS

| CN | 1413358 | 4/2003 |
| CN | 1426119 | 6/2003 |

(Continued)

OTHER PUBLICATIONS

Hsin-Chiao Fang, et al., "Semiconductor Device Containing Nitrogen," Unpublished U.S. Appl. No. 15/708,162, filed Sep. 19, 2017.
(Continued)

*Primary Examiner* — Brian Turner
(74) *Attorney, Agent, or Firm* — JCIPRNET

(57) ABSTRACT

A nitride semiconductor structure and a semiconductor light emitting device including the same are revealed. The nitride semiconductor structure mainly includes a stress control layer disposed between a light emitting layer and a p-type carrier blocking layer. The p-type carrier blocking layer is made from $Al_xGa_{1-x}N$ (0<x<1) while the stress control layer is made from $Al_xIn_yGa_{1-x-y}N$ (0<x<1, 0<y<1, 0<x+y<1). The light emitting layer has a multiple quantum well structure formed by a plurality of well layers and barrier layers stacked alternately. There is one well layer disposed between the two barrier layers. Thereby the stress control layer not only improves crystal quality degradation caused by lattice mismatch between the p-type carrier blocking layer and the light emitting layer but also reduces effects of compressive stress on the well layer caused by material differences.

17 Claims, 2 Drawing Sheets

Related U.S. Application Data continuation of application No. 13/963,104, filed on Aug. 9, 2013, now Pat. No. 9,048,364.

(51) Int. Cl.
*H01L 33/20* (2010.01)
*H01L 33/12* (2010.01)
*H01L 33/06* (2010.01)
*H01L 33/02* (2010.01)
*H01L 33/32* (2010.01)
*H01L 33/00* (2010.01)

(52) U.S. Cl.
CPC .............. *H01L 33/12* (2013.01); *H01L 33/14* (2013.01); *H01L 33/32* (2013.01)

(56) References Cited

U.S. PATENT DOCUMENTS

| | | |
|---|---|---|
| 2003/0085409 A1 | 5/2003 | Shen et al. |
| 2004/0264533 A1 | 12/2004 | Matsumura et al. |
| 2005/0224781 A1 | 10/2005 | Kneissl et al. |
| 2005/0224835 A1 | 10/2005 | Nomura et al. |
| 2006/0118820 A1 | 6/2006 | Gaska et al. |
| 2006/0175600 A1 | 8/2006 | Sato et al. |
| 2007/0045638 A1 | 3/2007 | Shen et al. |
| 2007/0096077 A1 | 5/2007 | Sanga et al. |
| 2007/0181869 A1 | 8/2007 | Gaska et al. |
| 2010/0142576 A1 | 6/2010 | Cohen et al. |
| 2011/0012089 A1 | 1/2011 | Khan et al. |
| 2011/0114916 A1 | 5/2011 | Yoshizumi et al. |
| 2012/0037881 A1 | 2/2012 | Kim et al. |
| 2012/0069863 A1 | 3/2012 | Sizov et al. |
| 2012/0217473 A1 | 8/2012 | Shur et al. |
| 2012/0319080 A1 | 12/2012 | Fudeta et al. |
| 2013/0161586 A1* | 6/2013 | Okuno .................... H01L 33/12 257/13 |
| 2013/0277642 A1 | 10/2013 | Kneissl et al. |
| 2014/0001438 A1* | 1/2014 | Kim ....................... H01L 29/151 257/18 |
| 2014/0183446 A1 | 7/2014 | Nago et al. |
| 2015/0179881 A1 | 6/2015 | Senes et al. |
| 2015/0263228 A1 | 9/2015 | Lee et al. |
| 2016/0118531 A1 | 4/2016 | Jain et al. |
| 2016/0322533 A1 | 11/2016 | Chang et al. |
| 2017/0117438 A1 | 4/2017 | Shur et al. |

FOREIGN PATENT DOCUMENTS

| | | |
|---|---|---|
| CN | 101073160 | 11/2007 |
| CN | 101339970 | 1/2009 |
| CN | 101494265 | 7/2009 |
| CN | 101645480 | 2/2010 |
| CN | 101684549 | 3/2010 |
| CN | 101944480 | 1/2011 |
| CN | 102130425 | 7/2011 |
| CN | 102185056 | 9/2011 |
| CN | 102214739 | 10/2011 |
| CN | 102214753 | 10/2011 |
| CN | 102474076 | 5/2012 |
| CN | 102881784 | 1/2013 |
| JP | H09321389 | 12/1997 |
| JP | 2000196143 | 7/2000 |
| JP | 2008034658 | 2/2008 |
| JP | 2009016452 | 1/2009 |
| JP | 2009152448 | 7/2009 |
| JP | 2010263140 | 11/2010 |
| JP | 2011023541 | 2/2011 |
| JP | 2014103384 | 6/2014 |
| TW | 402735 | 8/2000 |
| TW | 451504 | 8/2001 |
| TW | 200908393 | 2/2009 |
| TW | 201011952 | 3/2010 |
| TW | 201135967 | 10/2011 |
| WO | 2007013257 | 2/2007 |

OTHER PUBLICATIONS

"Office Action of U.S. Related Application, U.S. Appl. No. 14/257,012", dated Nov. 16, 2017, p. 1-p. 13.
"Office Action of Taiwan Related Application, application No. 106115426", dated Sep. 19, 2017, p. 1-p. 3.
"Office Action of U.S. Related Application, application No. 15499913", dated Jun. 30, 2017, p. 1-p. 24.
"Office Action of CN Related Application, application No. 201310029711.7", dated May 27, 2017, p. 1-p. 5.
"Office Action of Taiwan Related Application, application No. 105143135", dated Dec. 25, 2017, p. 1-p. 12.
"Office Action of Taiwan Related Application, application No. 106140004", dated Feb. 5, 2018, p. 1-p. 5.
"Office Action of U.S. Related Application, U.S. Appl. No. 15/627,419", dated Feb. 26, 2018, p. 1-p. 18.
"Office Action of U.S. Related Application, U.S. Appl. No. 15/499,913", dated Feb. 16, 2018, p. 1-p. 40.
"Office Action of JP Related Application, application No. 2017-093911", dated Mar. 6, 2018, p. 1-p. 3.
"Office Action of U.S. Related Application, U.S. Appl. No. 15/453,873", dated Mar. 5, 2018, p. 1-p. 9.
"Office Action of U.S. Appl. No. 15/723,117", dated Jul. 12, 2018, pp. 1-24.
"Office Action of U.S Appl. No. 15/981,864", dated Jul. 16, 2018, pp. 1-21.
"Notice of allowance of U.S. Appl. No. 15/627,419", dated Jul. 20, 2018, pp. 1-25.
"Office Action of U.S. Appl. No. 15/453,873", dated Sep. 26, 2018, pp. 1-11.

* cited by examiner

SEMICONDUCTOR STRUCTURE

CROSS-REFERENCE TO RELATED APPLICATION

This application is a continuation application of and claims the priority benefit of U.S. application Ser. No. 14/727,786, filed on Jun. 1, 2015, now allowed. The prior U.S. application Ser. No. 14/727,786 is a continuation application of and claims the priority benefit of U.S. application Ser. No. 13/963,104, filed on Aug. 9, 2013, U.S. Pat. No. 9,048,364. The prior U.S. application Ser. No. 13/963,104 claims the priority benefit of Taiwan application serial no. 101143115, filed on Nov. 19, 2012. The entirety of each of the above-mentioned patent applications is hereby incorporated by reference herein and made a part of this specification.

BACKGROUND OF THE INVENTION

1. Field of the Invention

The present invention relates to a nitride semiconductor structure and a semiconductor light emitting device including the same, especially to a nitride semiconductor structure in which a stress control layer made from $Al_xIn_yGa_{1-x-y}N$ is disposed between a light emitting layer and a p-type carrier blocking layer to improve crystal quality degradation caused by lattice mismatch between the p-type carrier blocking layer and the light emitting layer, increase the yield rate, and further reduce effects of compressive stress on quantum well layers. Thus electrons and holes are effectively confined in each quantum well layer and internal quantum efficiency is increased. Therefore the semiconductor light emitting device has a better light emitting efficiency.

2. Description of Related Art

In recent years, light emitting diodes (LED) have become more important in our daily lives due to their broad applications. LED is going to replace most of lighting devices available now and becoming a solid lighting element for the next generation. It's a trend to develop high energy saving, high efficiency and high power LED. Nitride LED has become one of the most popular optoelectronic semiconductor materials due to the advantages of compact volume, mercury-free, high efficiency and long service life. The wavelength of III-nitride covers almost covers the wavelength range of visible light so that it is a LED material with great potential.

Generally, for manufacturing nitride LED, firstly a buffer layer is formed on a substrate. Then an n-type semiconductor layer, a light emitting layer and a p-type semiconductor layer are formed over the buffer layer in turn by epitaxial growth. Next use photolithography and etching processes to remove a part of the p-type semiconductor layer and a part of the light emitting layer until a part of the n-type semiconductor layer is exposed. Later an n-type electrode and a p-type electrode are respectively formed on the exposed n-type semiconductor layer and the p-type semiconductor layer. A light emitting diode device is produced at last. The light emitting layer is in a multiple quantum well (MQW) structure formed by quantum well layers and quantum barrier layers disposed alternately. The band gap of the quantum well layer is lower than that of the quantum barrier layer, so that electrons and holes are confined in each quantum well layer of the MQW structure. Thus electrons and holes are respectively injected from the n-type semiconductor layer and the p-type semiconductor layer to be recombined with each other in the quantum well layers and photons are emitted.

However, the light efficiency of the LED can be affected by a plurality of factors such as current crowding, dislocation, etc. In theory, the light efficiency of LED is determined by external quantum efficiency, internal quantum efficiency and light-extraction efficiency. The internal quantum efficiency depends on material properties and quality. As to the light-extraction efficiency, it is defined as the ratio of the amount of light generated in the device and the amount of light escaping the device and radiated to the air. The light-extraction efficiency depends on the loss occurred while the light escaping the device. One of the main factors for the above loss is that the semiconductor material on the surface of the device has high refraction coefficient, so that total reflection occurs on surface of the material and photons are unable to be emitted. Once the light-extraction efficiency is improved, the external quantum efficiency of the semiconductor light emitting device is also increased. Thus various techniques for improving the internal quantum efficiency and the light-extraction efficiency have been developed in recent years. For example, the techniques include using indium tin oxide (ITO) as a current spreading layer, using the flip-flop, using patterned-sapphire substrate (PSS), using the current block layer (CBL), etc. Among the techniques used to improve the internal quantum efficiency, a method is to dispose a p-type carrier blocking layer (p-AlGaN) with high band gap between a multiple quantum well (MQW) structure and a p-type semiconductor layer. Thus more carriers are confined in the quantum well layers to increase electron-hole recombination rate and further improve light emitting efficiency. Therefore the brightness of LED is increased.

The MQW structure is generally formed by InGaN quantum well layers and GaN quantum barrier layers. Although the carriers can be effectively confined in the quantum well layers by using p-AlGaN as the p-type carrier blocking layer, there is high lattice mismatch between the p-AlGaN p-type carrier blocking layer and the GaN quantum barrier layer. Thus the InGaN quantum well layers are seriously affected by the compressive stress due to the lattice mismatch. The compressive stress changes band gap of each quantum well layer so that electrons and holes in the quantum well layers are separated from each other and the light emitting efficiency of the LED is reduced. Moreover, the compressive stress also degrades the adjacent GaN quantum barrier layers and interface properties among the InGaN quantum well layers so that carriers are lost at the interface and the light emitting efficiency of the LED is also affected.

Thus there is a room for improvement and a need to provide a novel nitride semiconductor structure and a semiconductor light emitting device including the same that overcome the above shortcomings.

SUMMARY OF THE INVENTION

Therefore it is a primary object of the present invention to provide a nitride semiconductor structure in which a stress control layer made from $Al_xIn_yGa_{1-x-y}N$ is disposed between a light emitting layer and a p-type carrier blocking layer for improving crystal quality degradation caused by lattice mismatch between the p-type carrier blocking layer and the light emitting layer, increasing the yield rate, and reducing effects of compressive stress on well layers. Thus electrons and holes are effectively confined in each well layer and the internal quantum efficiency is increased. Therefore a semiconductor light emitting device having the nitride semiconductor structure provides a better light emitting efficiency.

It is another object of the present invention to provide a semiconductor light emitting device including the above nitride semiconductor structure.

In order to achieve above objects, a semiconductor structure comprises a first-type doped semiconductor layer; a light emitting layer; an AlInGaN based stress control layer; an AlGaN based carrier blocking layer; and a second-type doped semiconductor layer, wherein the AlInGaN based stress control layer is disposed between the light emitting layer and the AlGaN based carrier blocking layer, and the AlGaN based carrier blocking layer is disposed between the second-type doped semiconductor layer and the AlInGaN based stress control layer.

A semiconductor structure comprises a first-type doped semiconductor layer; an AlGaN based first-type carrier blocking layer; a light emitting layer; an AlInGaN based stress control layer; an AlGaN based second-type carrier blocking layer; and a second-type doped semiconductor layer, wherein the AlGaN based first-type carrier blocking layer is disposed between the light emitting layer and the first-type doped semiconductor layer, the AlInGaN based stress control layer is disposed between the light emitting layer and the AlGaN based second-type carrier blocking layer, and the AlGaN based second-type carrier blocking layer is disposed between the second-type doped semiconductor layer and the AlInGaN based stress control layer.

A semiconductor structure comprises a first-type doped semiconductor layer; a light emitting layer having a multiple quantum well structure, wherein the multiple quantum well structure comprises a plurality of well layers and a plurality of barrier layers stacked alternately; a stress control layer, wherein a band gap of the stress control layer is larger than a band gap of the well layer; an AlGaN based carrier blocking layer; and a second-type doped semiconductor layer, wherein the stress control layer is disposed between the light emitting layer and the AlGaN based carrier blocking layer, and the AlGaN based carrier blocking layer is disposed between the second-type doped semiconductor layer and the stress control layer.

A semiconductor light emitting device including the above nitride semiconductor structure of the present invention includes an n-type electrode and a p-type electrode used together for providing electric power. The AlInGaN based stress control layer can not only improve crystal quality degradation caused by lattice mismatch between the p-type carrier blocking layer and the light emitting layer but also reduce effects of compressive stress on the InGaN well layer caused by material differences. Thus electrons and holes in the well layers are accumulated and confined therein more effectively. Therefore the internal quantum efficiency is increased.

Moreover, the reduction of the compressive stress also improves interface properties between the adjacent barrier layers and the well layers and reduces carrier loss at the interface. Thus the internal quantum efficiency is increased to make the semiconductor light emitting device have a better light emitting efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

In the following embodiments, when it is mentioned that a layer of something (or membrane) or a structure is disposed over or under a substrate, another layer of something (or membrane), or another structure, that means the two structures, the layers of something (or membranes), the layer of something and the substrate, or the structure and the substrate can be directly or indirectly connected. The indirect connection means there is at least one intermediate layer disposed therebetween.

Figure 1:
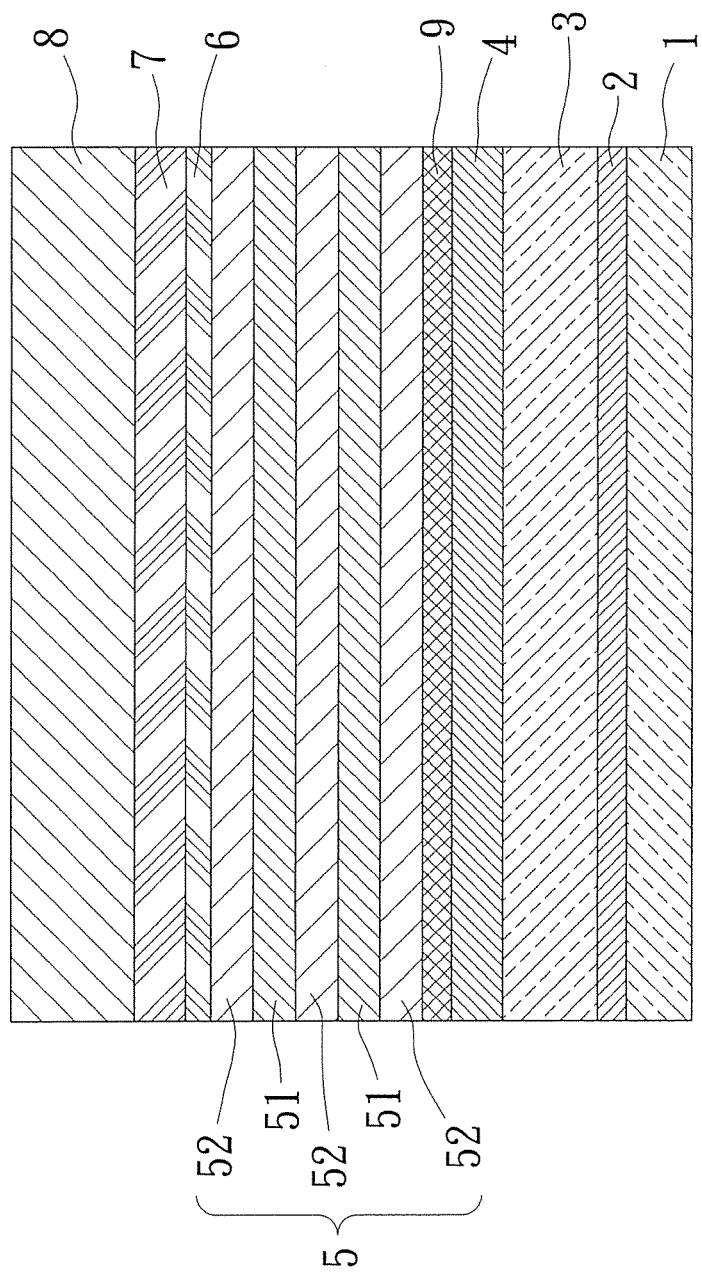
FIG. 1 is a schematic drawing showing a cross section of an embodiment of a nitride semiconductor structure according to the present invention.

Referring to FIG. 1, a nitride semiconductor structure of the present invention mainly includes a light emitting layer 5, a p-type carrier blocking layer 7 and a stress control layer 6 disposed between the light emitting layer 5 and the p-type carrier blocking layer 7. The light emitting layer 5 is in a multiple quantum well (MQW) having a plurality of well layers 51 and barrier layers 52 interleaved with each other. One well layer 51 is interposed between the two barrier layers 52. The p-type carrier blocking layer 7 is made from $Al_xGa_{1-x}N$ (0<x<1) while the stress control layer 6 is made from $Al_xIn_yGa_{1-x-y}N$ (0<x<1, 0<y<1, 0<x+y<1).

In the above embodiment, the barrier layer 52 is doped with an n-type dopant at a concentration ranging from $10^{16}$~$10^{18}$ cm$^{-3}$. A p-type semiconductor layer 8 is disposed over the p-type carrier blocking layer 7 and is doped with a p-type dopant at a concentration higher than $5 \times 10^{19}$ cm$^{-3}$. The thickness of the p-type semiconductor layer 8 is smaller than 30 nm. An n-type semiconductor layer 3 is disposed between the light emitting layer 5 and a substrate 1. Moreover, in this embodiment, there is an n-type carrier blocking layer 4 disposed between the light emitting layer 5 and the n-type semiconductor layer 3. The n-type carrier blocking layer 4 is made from $Al_xGa_{1-x}N$ (0<x<1). A super lattice layer 9 is disposed between the light emitting layer 5 and the n-type carrier blocking layer 4 to reduce lattice mismatch and dislocation density between the light emitting layer 5 and the n-type carrier blocking layer 4.

In this embodiment, the stress control layer 6 is doped with a p-type dopant at a concentration smaller than $10^{19}$ cm$^{-3}$ and an n-type dopant at a concentration smaller than $10^{19}$ cm$^{-3}$. The preferred p-type dopant is magnesium while the optimal n-type dopant is silicon. The p-type dopant is used as a receptor to increase the effective hole concentration while the n-type dopant is a donor for improving crystallization of the gallium nitride (GaN) based semiconductor layers. By doping the p-type dopant and the n-type dopant at the same time, good electro-optical properties are produced. The thickness of the above stress control layer 6 is ranging from 2 nm to 15 nm. The preferred thickness of the stress control layer 6 is smaller than the thickness of the well layer 51 of the multiple quantum well (MQW) structure.

While in use, the n-type semiconductor layer 3 is made from Si-doped gallium nitride while materials for the p-type semiconductor layer 8 are Mg-doped gallium nitride. The preferred MQW structure of the light emitting layer 5 is composed of InGaN well layers 51 and GaN barrier layers 52. As to the stress control layer 6 made from $Al_xIn_yGa_{1-x-y}N$, it is located between the p-type carrier blocking layer 7 and the light emitting layer 5.

By control of the amount of indium in the stress control layer 6 to make the amount of indium in the stress control layer 6 become equal or lower than the well layers 51 of the MQW structure, the stress control layer 6 whose energy gap is larger than the well layer 51 is formed. Thus carriers are confined in the well layers 51 of the MQW structure to increase electron-hole recombination rate and further improve internal quantum efficiency. Therefore the light emitting efficiency of the semiconductor light emitting device is significantly improved.

In addition, the $Al_xIn_yGa_{1-x-y}N$ stress control layer 6 of the present invention is not only used as a buffer layer between the p-type carrier blocking layer 7 and the light emitting layer 5, it's also able to improve crystal quality degradation caused by lattice mismatch between the p-type carrier blocking layer 7 and the light emitting layer 5 as well as reduce effects of compressive stress on the well layer 51 because that the band gap of InGaN containing indium is smaller than that of GaN while the band gap of AlGaN containing aluminum is larger than that of GaN. Thus electron and hole accumulation occurs in the well layer 51. Both electrons and holes are confined in adjacent well layer 51 so as to increase the internal quantum efficiency. Furthermore, the reduction of the compressive stress also enhances interface properties between the adjacent GaN barrier layer 52 and the InGaN well layer 51 and improves carrier loss at the interface. Thus the internal quantum efficiency is increased.

Figure 2:
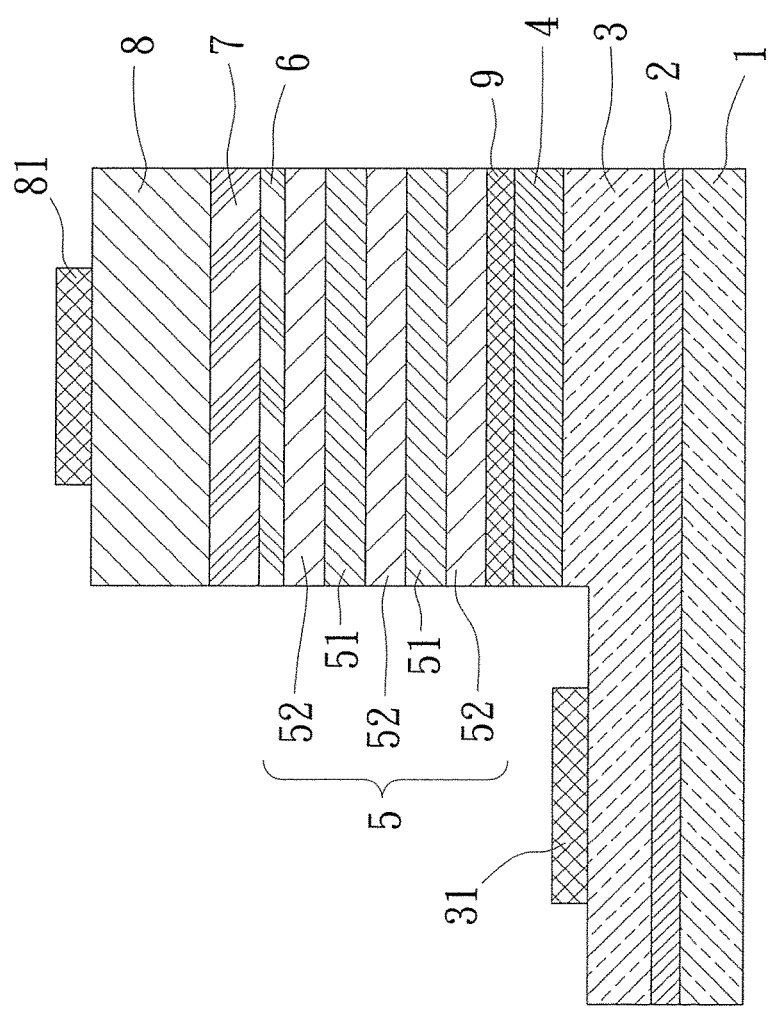
FIG. 2 is a schematic drawing showing a cross section of an embodiment of a semiconductor light emitting device including a nitride semiconductor structure according to the present invention.

The nitride semiconductor structure is applied to semiconductor light emitting devices. Referring to FIG. 2, a cross section of a semiconductor light emitting device including the nitride semiconductor structure of an embodiment according to the present invention is revealed. The semiconductor light emitting device includes at least: a substrate 1, an n-type semiconductor layer 3 disposed over the substrate 1 and made from Si-doped GaN, a light emitting layer 5 disposed over the n-type semiconductor layer 3 and having a multiple quantum well structure, a stress control layer 6 disposed over the light emitting layer 5, a p-type carrier blocking layer 7 disposed over the stress control layer 6 and made from $Al_xGa_{1-x}N$ (0<x<1), a p-type semiconductor layer 8 disposed over the p-type carrier blocking layer 7 and made from Mg-doped GaN, an n-type electrode 31 disposed on and in ohmic contact with the n-type semiconductor layer 3, and a p-type electrode 81 disposed at and in ohmic contact with the p-type semiconductor layer 8.

The multiple quantum well structure of the light emitting layer is formed by a plurality of well layers 51 and a plurality of barrier layers 52 stacked alternately. Each well layer 51 is disposed between two barrier layers 52. The well layer 51 and the barrier layer 52 are respectively made from InGaN and GaN. Thereby electrons and holes are more easily to be confined in the well layer 51 so that the electron-hole recombination rate increased and the internal quantum efficiency is improved.

The stress control layer 6 is made from $Al_xIn_yGa_{1-x-y}N$ while x and y satisfy following conditions: 0<x<1, 0<y<1, and 0<x+y<1. In this embodiment, the stress control layer 6 is doped with a p-type dopant (Mg is preferred) at a concentration smaller than $10^{19}$ $cm^{-3}$ and an n-type dopant (Si is preferred) at a concentration smaller than $10^{19}$ $cm^{-3}$. The thickness of the stress control layer 6 is ranging from 2 nm to 15 nm and this thickness is smaller than the thickness of the well layer 51. Moreover, aluminum ions in the p-type carrier blocking layer 7 are going to diffuse into the stress control layer 6 so that the amount of indium in the stress control layer 6 is equal to or smaller than the well layer 51 of the MQW structure. Thus the stress control layer 6 whose band gap is larger than that of the well layer 51 is formed. Therefore carriers are restricted in the well layers 51 of the MQW structure to increase the electron-hole recombination rate and improve the internal quantum efficiency.

The n-type electrode 31 and the p-type electrode 81 are used together to provide electric power and are made from (but not limited to) the following materials: titanium, aluminum, gold, chromium, nickel, platinum, and their alloys. The manufacturing processes are well-known to people skilled in the art.

Moreover, the semiconductor light emitting device further includes an n-type carrier blocking layer 4 and a buffer layer 2. The n-type carrier blocking layer 4 is disposed between the light emitting layer 5 and the n-type semiconductor layer 3 while the buffer layer 2 is disposed between the n-type semiconductor layer 3 and the substrate 1. The n-type carrier blocking layer 4 is made from material $Al_xGa_{1-x}N$ (0<x<1) so that carriers are confined in the well layers 51. Thus the electron-hole recombination rate is increased, the light emitting efficiency is improved, and the brightness of the semiconductor light emitting device is further enhanced. The buffer layer 2 is made from $Al_xGa_{1-x}N$ (0<x<1) and is used for solving the dislocation problem caused by lattice mismatch between the substrate 1 and the n-type semiconductor layer 3.

In summary, according to the above embodiments, the $Al_xIn_yGa_{1-x-y}N$ stress control layer 6 of the semiconductor light emitting device not only solves the problem of crystal quality degradation caused by lattice mismatch between the p-type carrier blocking layer 7 and the light emitting layer 5 for increasing the yield rate. It also reduces effects of compressive stress on the InGaN well layer 51 caused by material differences. Thus electrons and holes accumulate and confined more effectively in the well layer 51 so as to increase the internal quantum efficiency. Moreover, the reduction of the compressive stress also enhances interface properties between the adjacent barrier layers 52 and the well layers 51 and improves carrier loss at the interface. Therefore the internal quantum efficiency is increased and the semiconductor light emitting device gets a better light emitting efficiency.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:
1. A semiconductor structure comprising:
a first conductivity type semiconductor layer;
a light emitting layer comprises a multiple quantum well (MQW) structure, wherein the MQW structure comprises a plurality of well layers and a plurality of barrier layers stacked alternately;
a super lattice layer disposed between the light emitting layer and the first conductivity type semiconductor layer;
a second conductivity type semiconductor layer;

an aluminum-containing GaN based carrier blocking layer disposed between the light emitting layer and the second conductivity type semiconductor layer; and an indium-containing GaN based stress control layer disposed between the light emitting layer and the aluminum-containing GaN based carrier blocking layer, wherein a level of indium in the indium-containing GaN based stress control layer is equal to or smaller than a level of indium in well layers of the MQW structure, wherein the indium-containing GaN based stress control layer is doped with a first conductivity type dopant and a second conductivity type dopant.

2. The semiconductor structure as claimed in claim 1, wherein the indium-containing GaN based stress control layer further contains aluminum.

3. The semiconductor structure as claimed in claim 1, wherein both doped concentrations of the first conductivity type dopant and the second conductivity type dopant in the indium-containing GaN based stress control layer are smaller than $10^{19}$ cm$^{-3}$.

4. The semiconductor structure as claimed in claim 1, wherein the first conductivity type dopant is silicon and the second conductivity type dopant is magnesium.

5. The semiconductor structure as claimed in claim 1, further comprising an aluminum-containing GaN based carrier blocking layer disposed between the first conductivity type semiconductor layer and the super lattice layer.

6. The semiconductor structure as claimed in claim 1, wherein the second conductivity type semiconductor layer is doped with a second conductivity type dopant at a concentration higher than $5 \times 10^{19}$ cm$^{-3}$.

7. A semiconductor structure comprising:
a first conductivity type semiconductor layer;
a light emitting layer comprises a multiple quantum well (MQW) structure, wherein the MQW structure comprises a plurality of well layers and a plurality of barrier layers stacked alternately;
a second conductivity type semiconductor layer;
a GaN based carrier blocking layer containing aluminum, disposed between the light emitting layer and the second conductivity type semiconductor layer; and
a GaN based stress control layer containing indium and aluminum, disposed between the light emitting layer and the GaN based carrier blocking layer, wherein a level of aluminum in the GaN based stress control layer is smaller than or equal to a level of aluminum in the GaN based carrier blocking layer,
wherein the GaN based stress control layer is doped with a first conductivity type dopant and a second conductivity type dopant.

8. The semiconductor structure as claimed in claim 7, wherein a level of indium in the GaN based stress control layer is equal to or smaller than a level of indium in well layers of the MQW structure.

9. The semiconductor structure as claimed in claim 7, further comprising a super lattice layer disposed between the light emitting layer and the first conductivity type semiconductor layer.

10. The semiconductor structure as claimed in claim 9, further comprising an aluminum-containing GaN based carrier blocking layer disposed between the first conductivity type semiconductor layer and the super lattice layer.

11. The semiconductor structure as claimed in claim 7, wherein the first conductivity type dopant is silicon and the second conductivity type dopant is magnesium, and both doped concentrations of the first conductivity type dopant and the second conductivity type dopant in the GaN based stress control layer are smaller than $10^{19}$ cm$^{-3}$.

12. The semiconductor structure as claimed in claim 7, wherein the second conductivity type semiconductor layer is doped with a second conductivity type dopant at a concentration higher than $5 \times 10^{19}$ cm$^{-3}$.

13. The semiconductor structure as claimed in claim 7, further comprising an aluminum-containing GaN based carrier blocking layer disposed between the first conductivity type semiconductor layer and the light emitting layer.

14. A semiconductor structure comprising:
a first conductivity type semiconductor layer;
a light emitting layer comprises a multiple quantum well (MQW) structure, wherein the MQW structure comprises a plurality of well layers and a plurality of barrier layers stacked alternately;
a super lattice layer disposed between the light emitting layer and the first conductivity type semiconductor layer;
a second conductivity type semiconductor layer;
a GaN based carrier blocking layer containing aluminum, disposed between the light emitting layer and the second conductivity type semiconductor layer; and
a GaN based stress control layer containing indium and aluminum, disposed between the light emitting layer and the GaN based carrier blocking layer,
wherein a level of aluminum in the GaN based stress control layer is smaller than or equal to a level of aluminum in the GaN based carrier blocking layer,
wherein a level of indium in the GaN based stress control layer is equal to or smaller than a level of indium in well layers of the MQW structure, and
wherein the GaN based stress control layer is doped with a first conductivity type dopant and a second conductivity type dopant.

15. The semiconductor structure as claimed in claim 14, further comprising an aluminum-containing GaN based carrier blocking layer disposed between the first conductivity type semiconductor layer and the super lattice layer.

16. The semiconductor structure as claimed in claim 14, wherein the first conductivity type dopant is silicon and the second conductivity type dopant is magnesium, and both doped concentrations of the first conductivity type dopant and the second conductivity type dopant in the GaN based stress control layer are smaller than $10^{19}$ cm$^{-3}$.

17. The semiconductor structure as claimed in claim 14, wherein the second conductivity type semiconductor layer is doped with a second conductivity type dopant at a concentration higher than $5 \times 10^{19}$ cm$^{-3}$.

* * * * *